(12) United States Patent
Nagatani et al.

(10) Patent No.: US 7,856,069 B2
(45) Date of Patent: Dec. 21, 2010

(54) DISTORTION COMPENSATION APPARATUS

(75) Inventors: Kazuo Nagatani, Kawasaki (JP);
Hiroyoshi Ishikawa, Kawasaki (JP);
Nobukazu Fudaba, Kawasaki (JP);
Hajime Hamada, Kawasaki (JP);
Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 307 days.

(21) Appl. No.: 12/078,133

(22) Filed: Mar. 27, 2008

(65) Prior Publication Data

US 2008/0204136 A1 Aug. 28, 2008

Related U.S. Application Data

(63) Continuation of application No. PCT/JP2005/017792, filed on Sep. 28, 2005.

(51) Int. Cl.
*H04L 25/49* (2006.01)
*H03C 3/06* (2006.01)
(52) U.S. Cl. .................................. 375/296; 332/123
(58) Field of Classification Search .................. 375/285, 375/295, 296, 297; 455/114.2, 114.3, 91; 332/106, 107, 123, 124, 159, 160
See application file for complete search history.

(56) References Cited

U.S. PATENT DOCUMENTS

| | | | |
|---|---|---|---|
| 5,870,668 A | | 2/1999 | Takano et al. |
| 5,898,338 A * | | 4/1999 | Proctor et al. ............... 330/149 |
| 6,836,517 B2 | | 12/2004 | Nagatani et al. |
| 7,430,250 B2 * | | 9/2008 | Shako et al. ............... 375/296 |
| 7,486,744 B2 * | | 2/2009 | Shako et al. ............... 375/296 |
| 7,613,251 B2 * | | 11/2009 | Shako et al. ............... 375/296 |
| 2001/0005402 A1 * | | 6/2001 | Nagatani et al. ............ 375/296 |
| 2003/0118125 A1 | | 6/2003 | Doi |
| 2005/0009479 A1 | | 1/2005 | Braithwaite |
| 2005/0226346 A1 * | | 10/2005 | Ode et al. .................... 375/296 |

(Continued)

FOREIGN PATENT DOCUMENTS

JP  9-69733  3/1997

(Continued)

OTHER PUBLICATIONS

Supplementary European Search Report dated Sep. 30, 2008 issued in corresponding European Application No. 05787565.0-1233.

(Continued)

*Primary Examiner*—Tesfaldet Bocure
(74) *Attorney, Agent, or Firm*—Hanify & King, P.C.

(57) ABSTRACT

A distortion compensation apparatus includes an amplifier for amplifying an input signal, a calculation unit for obtaining a distortion compensation coefficient of the amplifier corresponding to an amplitude level of the input signal, based on the input signal input to the amplifier and an output signal output from the amplifier, a memory for storing the distortion compensation coefficient, obtained by the calculation unit, into a write address being made to correspond to the input signal amplitude level, a distortion compensation processing unit for reading out the distortion compensation coefficient from the readout address of the memory, and for performing distortion compensation processing of the input signal using the distortion compensation coefficient, and an address generator for generating the write address and the readout address, based on the input signal amplitude level.

8 Claims, 5 Drawing Sheets

U.S. PATENT DOCUMENTS

2009/0227216 A1* 9/2009 Lozhkin .................. 455/114.3

FOREIGN PATENT DOCUMENTS

| JP | 2000-278190 | 10/2000 |
|---|---|---|
| JP | 3187251 | 5/2001 |
| JP | 2001-189685 | 7/2001 |
| JP | 2002-223171 | 8/2002 |
| JP | 2003-188656 | 7/2003 |
| JP | 2003-347944 | 12/2003 |
| JP | 2005026998 | 1/2005 |

OTHER PUBLICATIONS

Notification of Reason for Rejection dated Jun. 29, 2010, from the corresponding Japanese Patent application No. 2007-537490.

* cited by examiner

DISTORTION COMPENSATION APPARATUS

CROSS REFERENCE TO RELATED APPLICATIONS

This application is a continuation of International Application No. PCT/JP2005/17792, filed on Sep. 28, 2005, now pending, herein incorporated by reference.

TECHNICAL FIELD

The present invention relates to a distortion compensation apparatus, and more particularly, a distortion compensation apparatus for use in a power amplifier for amplifying linearly modulated signals, a low noise amplifier for use in a receiver unit of linearly modulated signals, and the like.

BACKGROUND ART

As a power amplifier for amplifying linearly modulated signals and a low noise amplifier for use in a receiver unit of linearly modulated signals, an amplifier having high linearity is required to suppress deterioration of a transmission characteristic caused by a spectral characteristic and signal distortion.

In particular, when a multilevel amplitude modulation scheme is applied to radio communication, a technique is required on the transmission side for linealizing the amplification characteristic of the power amplifier, thereby suppressing nonlinear distortion and reducing adjacent channel leakage power. Further, while high power efficiency is generally required in the amplifier at all times, the linearity and the efficiency in the amplifier are generally contradictory characteristics. When it is intended to improve the power efficiency by use of an amplifier having a degraded linearity, a technique for compensating the distortion produced therefrom is essential.

As one system for compensating distortion, a predistortion system is known. The principle of the predistortion system is that a characteristic inverse to the distortion characteristic of the amplifier is added in advance to the input signals of the amplifier, so as to obtain desired non-distorted signals in the output of the amplifier. As to the predistortion system, detailed descriptions have been given in the following Patent documents 1, 2 and 3, for example.

A transmission signal before distortion compensation is compared with a demodulated feedback signal, and using the error thereof, a distortion compensation coefficient is calculated and updated. The distortion compensation coefficient is stored into a memory, using transmission signal amplitude, power, or the function thereof, as an address. Then, on the transmission signal to be transmitted next, predistortion processing is performed and output, using an updated distortion compensation coefficient. By repeating the above operation, finally, convergence is made to an optimal distortion compensation coefficient, and thus, the distortion in the transmission power amplifier is compensated.

[Patent document 1] The official gazette of the Japanese Unexamined Patent Publication No. Hei-9-69733.

[Patent document 2] The official gazette of the Japanese Unexamined Patent Publication No. 2001-189685.

[Patent document 3] The official gazette of the Japanese Unexamined Patent Publication No. 2000-278190.

DISCLOSURE OF THE INVENTION

Problem to be Solved by the Invention

However, from the nature of the transmission signals, there are deviations in the occurrence frequencies of the memory addresses, for example, the amplitude levels of the transmission signals, in which the distortion compensation coefficients are stored. Since the distortion compensation coefficients are calculated and updated on the basis of each memory address (amplitude level) for storage thereof, in regard to the addresses having small occurrence frequencies, there is a problem that a state of slow convergence, or no convergence, of the distortion compensation coefficients occurs, and the distortion cannot be compensated.

Accordingly, it is an object of the present invention to provide a distortion compensation apparatus capable of executing distortion compensation stably and effectively, even in regard to an address of slow convergence or no convergence.

Means to Solve the Problem

As a first configuration of the distortion compensation apparatus according to the present invention to achieve the aforementioned object, the distortion compensation apparatus includes: an amplifier amplifying an input signal; a calculation unit obtaining a distortion compensation coefficient of the amplifier corresponding to an amplitude level of the input signal, based on the input signal input to the amplifier and an output signal output from the amplifier; a memory storing the distortion compensation coefficient obtained by the calculation unit into a write address being made to correspond to the input signal amplitude level; a distortion compensation processing unit reading out the distortion compensation coefficient from the readout address of the memory, and performing distortion compensation processing of the input signal using the distortion compensation coefficient; and an address generator generating the write address and the readout address, based on the input signal amplitude level. The above address generator decides a first address obtained on the basis of the input signal amplitude level as write address, and a second address adjacent to the first address as readout address.

As a second configuration of the distortion compensation apparatus according to the present invention, in the above first configuration, the address generator obtains the second address from a plurality of addresses adjacent to the first address in a random manner.

As a third configuration of the distortion compensation apparatus according to the present invention, in the above second configuration, the address generator includes a random value generator generating an N-bit random value, and generates the second address by replacing lower N bits in M bits constituting the first address (M>N) with the N-bit random value generated by the random value generator.

As a fourth configuration of the distortion compensation apparatus according to the present invention, in the above second configuration, the address generator includes a random value generator generating a random value, and generates the second address by adding the random value generated by the random value generator to the first address.

As a fifth configuration of the distortion compensation apparatus according to the present invention, in the above fourth configuration, the address generator includes a timing signal generator generating a predetermined timing signal, and generates the second address by adding the random value to the first address, according to the output timing of the timing signal.

As a sixth configuration of the distortion compensation apparatus according to the present invention, in the above first or second configuration, when the write address and the readout address of the memory are addresses of a plurality of dimensions constituted of a plurality of coordinates, including coordinates corresponding to the input signal amplitude level, the address generator generates the readout address from the coordinates adjacent to each coordinate constituting the write address.

As a seventh configuration of the distortion compensation apparatus according to the present invention, in the above first or second configuration, the address generator narrows the second address range adjacent to the first address, according to the lapse of time.

As an eighth configuration of the distortion compensation apparatus according to the present invention, in the above first or second configuration, the address generator obtains a means value of the input signal amplitude level, and generates the second address adjacent to the near side of the means value.

Effects of the Invention

According to the present invention, in regard to a distortion compensation coefficient of an address (amplitude level) having a relatively low occurrence frequency, by performing distortion compensation using the distortion compensation coefficient of an adjacent address, it becomes possible to make convergence earlier. Also, it is possible to realize the above effect with a relatively simple circuit configuration, making it possible to perform distortion compensation more accurately and stably.

DESCRIPTION OF SYMBOLS

Figure 1:
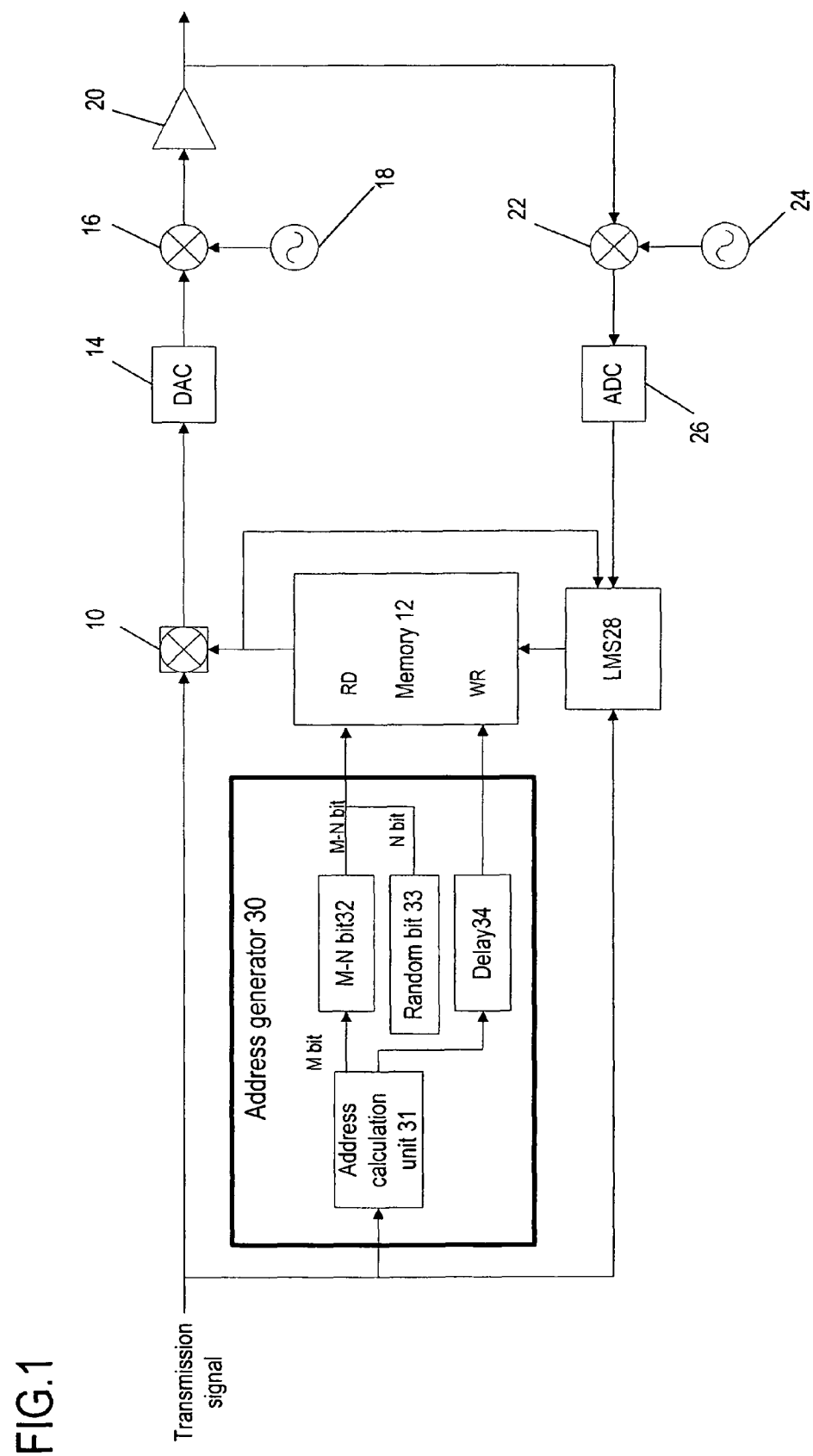
FIG. 1 shows a first exemplary configuration of a distortion compensation apparatus according to an embodiment of the present invention.

10: multiplier, 12: memory, 14: DAC, 16: quadrature modulator, 18: local oscillator, 20: power amplifier, 22: quadrature demodulator, 24: local oscillator, 26: ADC, 28: distortion compensation coefficient calculation unit, 30: address generator, 31: address calculation unit, 32 lower bit deletion unit, 33: lower bit generator, 34: delay unit, 35: random bit generator, 36: adder, 37: timing signal generator, 38: gate

BEST MODE FOR IMPLEMENTING THE INVENTION

The embodiment of the present invention is described hereinafter referring to the drawings. However, it is noted that the embodiments of the present invention are not intended to limit the technical scope of the present invention.

FIG. 1 shows a first exemplary configuration of a distortion compensation apparatus according to an embodiment of the present invention. In FIG. 1, a digital transmission signal constituted of an I signal and a Q signal is multiplied in a multiplier 10 by a distortion compensation coefficient read out from a memory 12, and then input into a DAC 14 and converted into an analog baseband signal, and further, input into an quadrature modulator 16. Quadrature modulator 16 multiplies each of the analog I signal and Q signal by a reference carrier signal from a local oscillator 18 and a signal orthogonal thereto, respectively, and by adding the above multiplication results, generates and outputs an orthogonally modulated signal. The orthogonally modulated signal is amplified by a power amplifier 20, and radiated from an aerial (antenna). By multiplying the distortion compensation coefficient by the transmission signal in multiplier 10, distortion in the amplification characteristic of the above power amplifier 20 is canceled. Namely, multiplier 10 functions as a distortion compensation processing unit. Additionally, in the figures shown in the present specification, the I signal and the Q signal are illustrated by one signal line, for the sake of simplification.

A portion of the orthogonally modulated signal is made to branch by a directional coupler (not shown), and feedbacked to quadrature demodulator 22. By multiplying the orthogonally modulated signal by an oscillation signal from a local oscillator 24, and by a signal orthogonal thereto, quadrature demodulator 22 demodulates into the I signal and the Q signal. The demodulated analog I signal and Q signal are input into an ADC 26, converted into a digital transmission signal, and input into a distortion compensation coefficient calculation unit 28, as a feed back signal. Additionally, the frequency of local oscillator 24 is identical to the frequency of local oscillator 18, and it is possible to commonize local oscillators 18, 24.

By means of adaptive signal processing using an LMS (Least Mean Square) algorithm, distortion compensation coefficient calculation unit (LMS) 28 compares the transmission signal before distortion compensation with the demodulated feedback signal, and using the error thereof, calculates and updates the distortion compensation coefficient. The obtained distortion compensation coefficient is written into memory 12, and memorized.

An address generator 30 generates by calculation the address of a distortion compensation coefficient to be read out from memory 12, and the address of a distortion compensation coefficient to be stored into memory 12. The distortion compensation coefficient obtained by distortion compensation coefficient calculation unit 28 is stored into the position of the write address generated by address generator 30. Also, the distortion compensation coefficient to be supplied to multiplier 10 for predistortion processing is read out from the position of the readout address generated by address generator 30.

In the first exemplary configuration, address generator 30 includes an address calculation unit 31, a lower bit deletion unit (M-N bit) 32, a lower bit generator (random bit) 33, and a delay unit 34. Address calculation unit 31 calculates an address corresponding to the amplitude level of an actual transmission signal. When the transmission signal is expressed as x(t), address calculation unit 31 calculates an amplitude level $|x(t)|^2$ as address. In the conventional configuration, the address obtained by address calculation unit 31 is output to memory 12, as readout address and write address. Now, a predetermined time period is required from when a distortion compensation coefficient is read out from the obtained readout address, and an orthogonally modulated signal is feedbacked, to when a next distortion compensation coefficient is obtained by distortion compensation coefficient calculation unit 28. Delay unit 34 delays the write address output to memory 12 for the above time period, so that a new distortion compensation coefficient is written into a corresponding address.

Then, as a characteristic configuration in the embodiment of the present invention, according to the first exemplary configuration, to an M-bit address obtained by address calculation unit 31 (hereafter, there may be cases referred to as "original address"), by randomly varying the lower N bits thereof (M>N), an address adjacent to the original address is given to memory 12, as readout address, and the distortion compensation coefficient in the above adjacent address is read out, so as to be used in the predistortion processing. From the original M-bit address, the lower N bits are subtracted by a lower bit deletion unit (M-N bit) 32, and then, random N bits generated by a lower bit generator (random bit) 33 is synthesized, and output to memory 12, as readout address. Here, the write address is not the adjacent address, but the exact original address having been obtained by address calculation unit 31.

The distortion compensation coefficients in adjacent addresses have mutual correlation. More specifically, because nonlinear distortion in the amplification characteristic is gradually changed according to the amplitude level, it is highly possible that the distortion compensation coefficients in the adjacent addresses mutually have near values. By reading out the distortion compensation coefficients in the adjacent address, for example, when an amplitude level in the transmission signal corresponding to the original address has a low occurrence frequency, resulting in a slow convergence of the distortion compensation coefficients, earlier convergence of the distortion compensation coefficients of the original address can be obtained when predistortion processing is performed using the distortion compensation coefficient in the adjacent address, and based on the above distortion compensation coefficient, the distortion compensation coefficient in the original address is updated. Also, more accurate distortion compensation can be attained.

Oppositely, there may be considered a possibility of slow convergence of the distortion compensation coefficient in the address adjacent to the original address. However, as shown in the first exemplary configuration, by randomly varying the adjacent address for readout, instead of fixing the adjacent address for readout, by configuring to randomly read out from a plurality of addresses adjacent to the original address, the convergence of the distortion compensation coefficients in the overall plurality of addresses in the periphery of the original address can be promoted without delaying the convergence of the distortion compensation coefficient of the particular original address.

Figure 2:
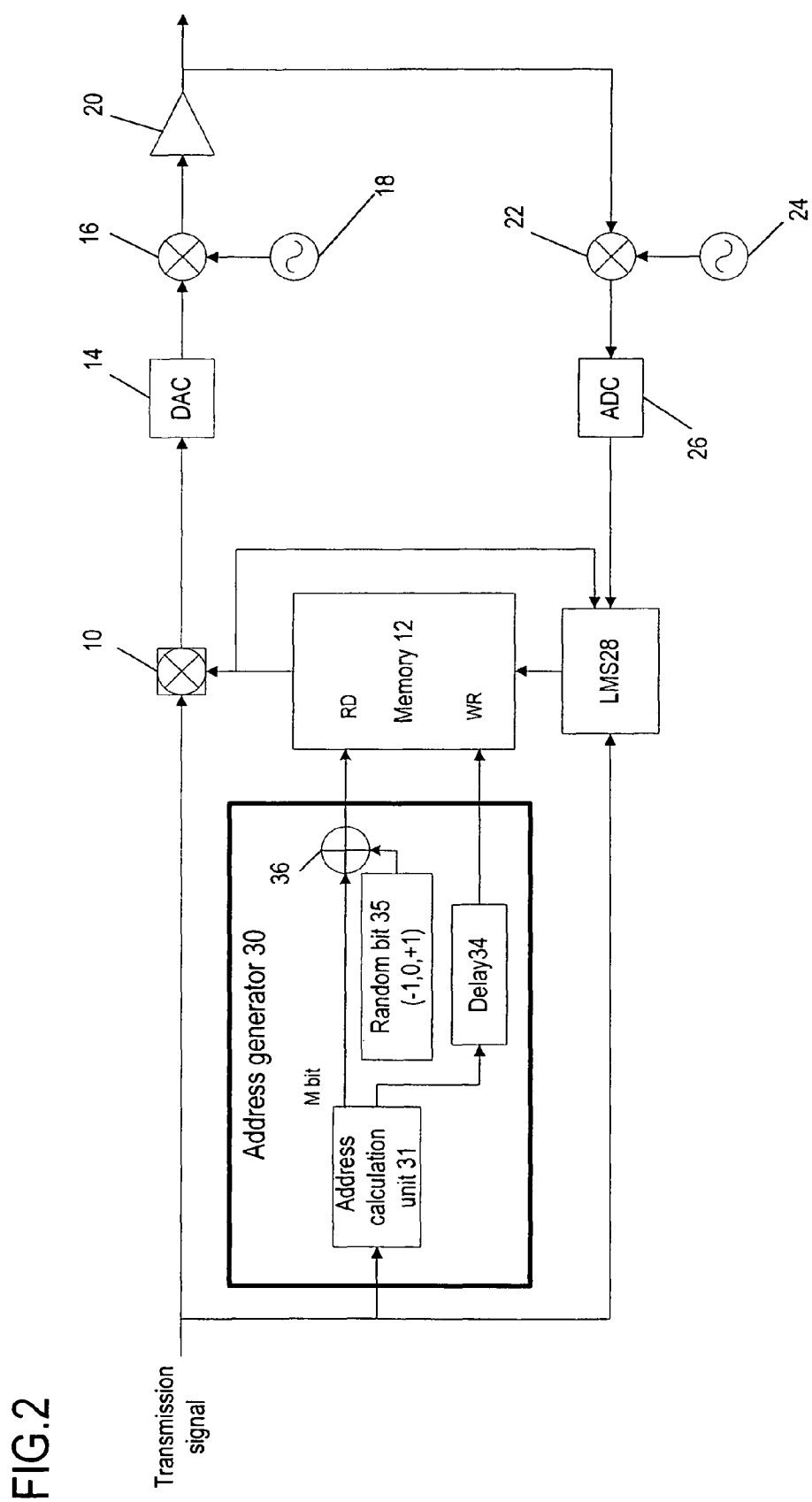
FIG. 2 shows a second exemplary configuration of a distortion compensation apparatus according to an embodiment of the present invention.

FIG. 2 shows a second exemplary configuration of a distortion compensation apparatus according to an embodiment of the present invention. As compared with the first exemplary configuration shown in FIG. 1, in place of lower bit deletion unit 32 and lower bit generator 33, the configuration shown in FIG. 2 includes a random bit generator 35 randomly generating values (bits) of 1, 0 and -1. An adder 36 obtains an address by adding the random bit from the random bit generator 35 to the original M-bit address obtained by address calculation unit 31, so as to output the above obtained address to memory 12 as readout address. Other configurations are similar to the first configuration.

The function and the effect of the second exemplary configuration are also similar to the first configuration, and by configuring to randomly read out an address adjacent to the original address, it is possible to rapidly converge the distortion compensation coefficients of the original address and the address adjacent thereto.

Figure 3:
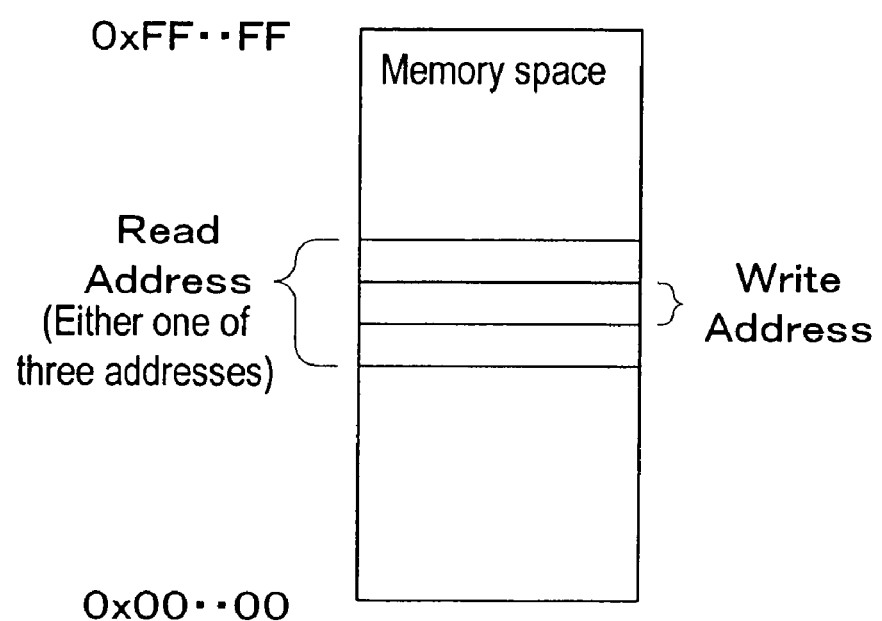
FIG. 3 shows a diagram explaining a readout address and a write address in the second exemplary configuration.

FIG. 3 shows a diagram explaining a readout address and a write address in the second exemplary configuration. As shown in FIG. 3, the write address is the original address, and the readout address is either the original address or any of the adjacent addresses located before and after the original address.

Figure 4:
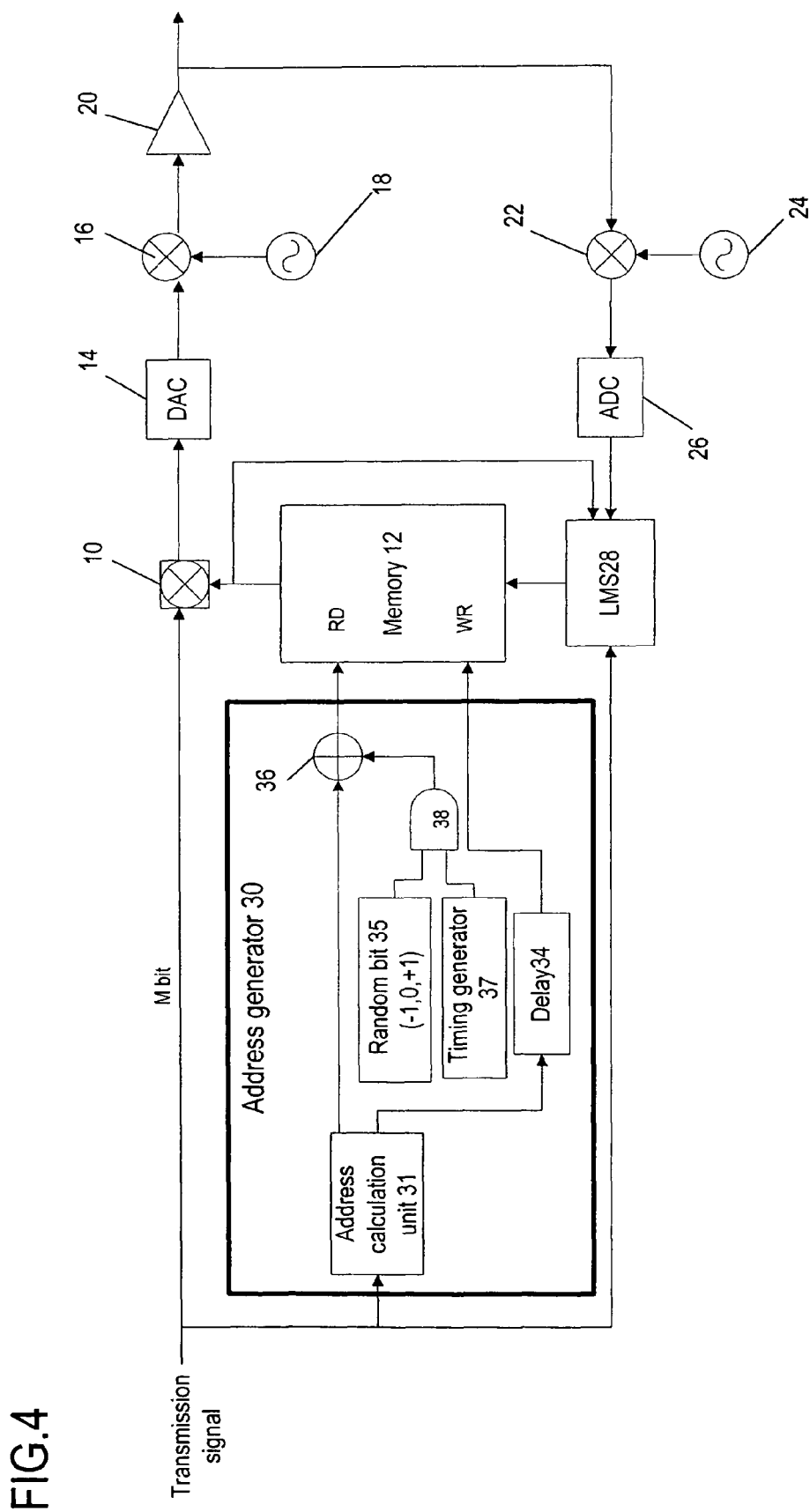
FIG. 4 shows a third exemplary configuration of a distortion compensation apparatus according to an embodiment of the present invention.

FIG. 4 shows a third exemplary configuration of a distortion compensation apparatus, according to an embodiment of the present invention. As compared with the second exemplary configuration shown in FIG. 2, the configuration shown in FIG. 4 further includes a timing generator 37 and a gate 38, so as to configure that a random bit at the timing when an enable signal from timing generator 37 is in an On state is added to the original address. The On/Off states of the enable signal vary either randomly or periodically. Alternatively, it is also possible to perform readout operation from an adjacent address under a predetermined condition, for example, by adding a random value, on detection of an amplitude level having a relatively low occurrence frequency, such as when the transmission signal amplitude level is a predetermined level or higher, or below a predetermined level.

In the above-mentioned embodiments, there has been described an example in which the address of memory 12 is one-dimensionally mapped according to the transmission signal amplitude level. However, it may also be possible to introduce two-dimensional mapping according to a transmission signal change rate (namely, gradient) in addition to the amplitude level. The transmission signal change rate is obtained as a differentiated value of the transmission signal x(t).

Figure 5:
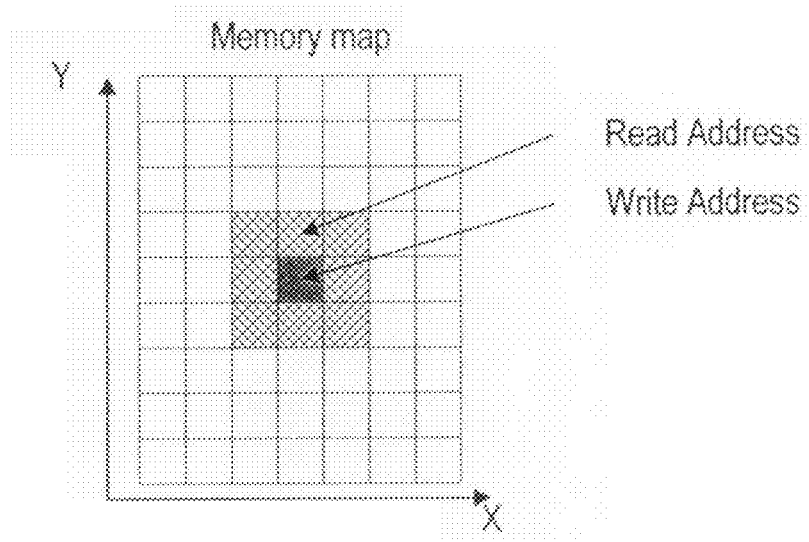
FIG. 5 shows a diagram illustrating a two-dimensional map of memory addresses.

FIG. 5 shows a diagram illustrating a two-dimensional map of memory addresses. For example, the X-direction is the coordinate of an amplitude level, while the Y-direction is the coordinate of a change rate, and an address is given by the X-coordinate and the Y-coordinate. Address generator 30 calculates both the amplitude level and the change rate of the transmission signal, respectively, and obtains a two-dimensional original address (write address). Then, as shown in the second exemplary configuration of FIG. 2, when random values of ±1 are added to the coordinate value of each direction of the original address, addresses adjacent to the periphery of the original address (write address) become readout addresses, one of which is randomly selected.

Also in case when the memory address is mapped with three dimensions or a higher number of dimensions, the coordinates adjacent to each coordinate are obtained for each direction (each dimension), and the readout address is configured of each adjacent coordinate obtained above.

Figure 6:
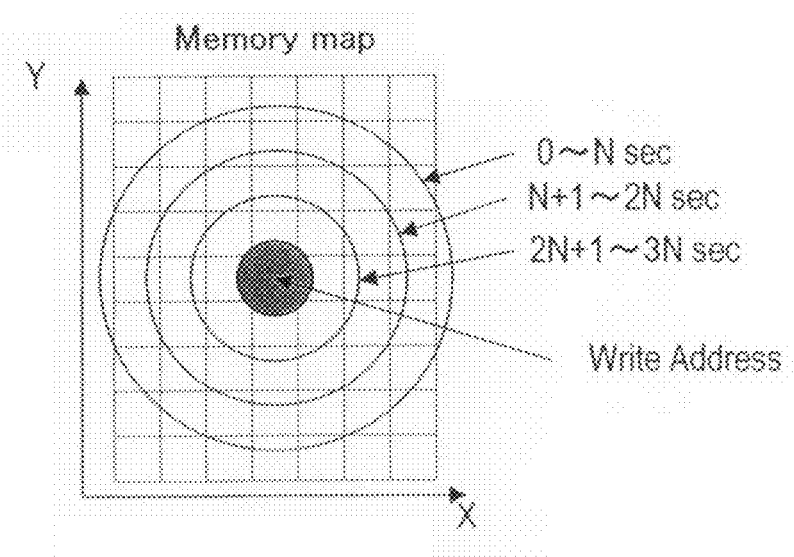
FIG. 6 shows a diagram illustrating an example in case of temporally varying the readout address range of two-dimensionally mapped memory addresses.

FIG. 6 shows a diagram illustrating an example in case of temporally varying the readout address range of the two-dimensionally mapped memory addresses. In FIG. 6, for a period of N seconds from the start of the readout operation, random readout is performed from an address distant by ±3 in the X direction and the Y direction, respectively, from the original address, and for a period of next N seconds (from N+1 second to 2N second), random readout is performed from an address distant by ±2, and further, for a period of next N seconds (from 2N+1 second to 3N second), random readout is performed from an address distant by ±1, and after 3N+1 second, the readout is performed from the original address, instead of reading out from any adjacent address. The write address is the original address from the start of the operation. With the lapse of time, the distortion compensation coefficient in each address is being converged, and therefore, as the time elapses, the readout range is narrowed. As such, it is applicable to narrow the readout address range adjacent to the write address, according to the lapse of time, to a case of one-dimensional address using the amplitude level only or a case of address having three dimensions or more, needless to say.

As having been described above, according to the embodiments of the present invention, by using an address adjacent to the write address as a readout address of the distortion compensation coefficient stored in the memory, it is possible to make convergence of the distortion compensation coefficients earlier in the overall addresses, even when deviations exist in address occurrence frequencies. In addition, preferably, the adjacent address is selected from among a plurality of addresses adjacent to the write address. Further, preferably, an address adjacent to the above mean value side is selected after a mean value of the transmission signal amplitude levels is obtained. The reason is that the above method contributes to a more prompt convergence of the distortion compensation coefficient.

INDUSTRIAL APPLICABILITY

The present invention is applicable to distortion compensation in a power amplifier having nonlinear distortion in the amplification characteristic, and in particular, applicable to a power amplifier for amplifying a transmission modulation signal in radio communication.

What is claimed is:

1. A distortion compensation apparatus comprising:
   an amplifier amplifying an input signal;
   a calculation unit obtaining a distortion compensation coefficient of the amplifier corresponding to an amplitude level of the input signal, based on the input signal input to the amplifier and an output signal output from the amplifier;
   a memory storing the distortion compensation coefficient obtained by the calculation unit into a write address being made to correspond to the input signal amplitude level;
   a distortion compensation processing unit reading out the distortion compensation coefficient from the readout address of the memory, and performing distortion compensation processing of the input signal using the distortion compensation coefficient; and
   an address generator generating the write address and the readout address, based on the input signal amplitude level,
   wherein the address generator decides a first address obtained based on a first input signal amplitude level as write address, and a second address corresponding to a second input signal amplitude level which is close to the first input signal amplitude level as readout address.

2. The distortion compensation apparatus according to claim 1, wherein the address generator obtains the second address from a plurality of addresses corresponding to the second input signal amplitude level close to the first input signal amplitude level in a random manner.

3. The distortion compensation apparatus according to claim 2,
   wherein the address generator includes a random value generator generating an N-bit random value, and generates the second address by replacing lower N bits in M bits constituting the first address (M>N) with the N-bit random value generated by the random value generator.

4. The distortion compensation apparatus according to claim 2,
   wherein the address generator includes a random value generator generating a random value, and generates the second address by adding the random value generated by the random value generator to the first address.

5. The distortion compensation apparatus according to claim 4,
   wherein the address generator includes a timing signal generator generating a predetermined timing signal, and generates the second address by adding the random value to the first address, according to the output timing of the timing signal.

6. The distortion compensation apparatus according to claim 1,
   wherein, when the write address and the readout address of the memory are addresses of a plurality of dimensions constituted of a plurality of coordinates, including coordinates corresponding to the input signal amplitude level, the address generator generates the readout address from the coordinates adjacent to each coordinate constituting the write address.

7. The distortion compensation apparatus according to claim 1,
   wherein the address generator narrows the second address range adjacent to the first address, according to the lapse of time.

8. The distortion compensation apparatus according to claim 1,
   wherein the address generator obtains a means value of the input signal amplitude level, and generates the second address adjacent to the near side of the means value.

* * * * *